(12) United States Patent
Balsdon et al.

(10) Patent No.: US 8,171,447 B1
(45) Date of Patent: *May 1, 2012

(54) AUTOMATICALLY ROUTING NETS ACCORDING TO CURRENT DENSITY RULES

(75) Inventors: Graham Balsdon, Glos (GB); Jeremy Birch, Bristol (GB); Mark Williams, Glos (GB); Mark Waller, Bristol (GB); Tim Parker, Bristol (GB); Fumiaki Sato, Tokyo (JP)

(73) Assignee: Pulsic Limited (GB)

( * ) Notice: Subject to any disclaimer, the term of this patent is extended or adjusted under 35 U.S.C. 154(b) by 232 days.

This patent is subject to a terminal disclaimer.

(21) Appl. No.: 12/408,211

(22) Filed: Mar. 20, 2009

Related U.S. Application Data

(60) Continuation of application No. 11/383,658, filed on May 16, 2006, now Pat. No. 7,530,040, which is a division of application No. 10/709,843, filed on Jun. 1, 2004, now Pat. No. 7,131,096.

(51) Int. Cl.
*G06F 17/50* (2006.01)
(52) U.S. Cl. ........................................ 716/129; 716/130
(58) Field of Classification Search ........... 716/126–131
See application file for complete search history.

(56) References Cited

U.S. PATENT DOCUMENTS

| | | | |
|---|---|---|---|
| 4,615,011 A | 9/1986 | Linsker | |
| 4,673,966 A | 6/1987 | Shimoyama | |
| 4,777,606 A | 10/1988 | Fournier | |
| 4,782,193 A | 11/1988 | Linsker | |
| 4,811,237 A | 3/1989 | Putatunda et al. | |
| 4,815,003 A | 3/1989 | Putatunda et al. | |
| 4,855,253 A | 8/1989 | Weber | |
| 4,965,739 A | 10/1990 | Ng et al. | |
| 5,072,402 A | 12/1991 | Ashtaputre et al. | |
| 5,272,645 A | 12/1993 | Kawakami et al. | |
| 5,353,235 A | 10/1994 | Do et al. | |
| 5,375,069 A | 12/1994 | Satoh et al. | |
| 5,500,804 A | 3/1996 | Honsinger et al. | |
| 5,541,005 A | 7/1996 | Bezama et al. | |
| 5,550,748 A | 8/1996 | Xiong | |
| 5,635,736 A | 6/1997 | Funaki et al. | |
| 5,636,129 A | 6/1997 | Her | |
| 5,637,920 A | 6/1997 | Loo | |
| 5,640,327 A | 6/1997 | Ting | |
| 5,646,830 A | 7/1997 | Nagano | |
| 5,650,653 A | 7/1997 | Rostoker et al. | |
| 5,689,433 A | 11/1997 | Edwards | |

(Continued)

OTHER PUBLICATIONS

Finch, "A Method for Gridless Routing of Printed Circuit Boards", Paper 32.2, 22nd Design Automation Conference, IEEE, 1985, pp. 509-515, Racal-Redac Ltd., Newtown, Tewkesbury, Glos, United Kingdom.

(Continued)

*Primary Examiner* — Jack Chiang
*Assistant Examiner* — Binh Tat
(74) *Attorney, Agent, or Firm* — Aka Chan LLP

(57) ABSTRACT

A technique will automatically route interconnect of an integrated circuit while taking into consideration current density rules. In an implementation, the technique uses a shape-based approach where a grid is not used. Based on data input including current density and a frequency of each net, the technique will determine the current requirements for each net. In an implementation, the technique forms a Steiner tree for a net, and routs using the Steiner tree. The technique widens nets having greater current requirements; adjacent wiring may be pushed aside to create sufficient space for wider nets.

18 Claims, 6 Drawing Sheets

U.S. PATENT DOCUMENTS

| | | | |
|---|---|---|---|
| 5,723,908 A | 3/1998 | Fuchida et al. | |
| 5,757,089 A | 5/1998 | Ishizuka | |
| 5,784,289 A | 7/1998 | Wang | |
| 5,801,385 A | 9/1998 | Endo et al. | |
| 5,801,959 A | 9/1998 | Ding et al. | |
| 5,811,863 A | 9/1998 | Rostoker et al. | |
| 5,822,214 A | 10/1998 | Rostoker et al. | |
| 5,880,969 A | 3/1999 | Hama et al. | |
| 5,889,329 A | 3/1999 | Rostoker et al. | |
| 5,980,093 A | 11/1999 | Jones et al. | |
| 6,111,756 A | 8/2000 | Moresco | |
| 6,150,193 A | 11/2000 | Glenn | |
| 6,219,823 B1 | 4/2001 | Hama et al. | |
| 6,260,183 B1 | 7/2001 | Raspopovic et al. | |
| 6,262,487 B1 | 7/2001 | Igarashi et al. | |
| 6,263,475 B1 | 7/2001 | Toyonaga et al. | |
| 6,282,693 B1 | 8/2001 | Naylor et al. | |
| 6,301,686 B1 | 10/2001 | Kikuchi et al. | |
| 6,301,693 B1 | 10/2001 | Naylor et al. | |
| 6,307,256 B1 | 10/2001 | Chiang et al. | |
| 6,311,313 B1 | 10/2001 | Camporese et al. | |
| 6,316,838 B1 | 11/2001 | Ozawa et al. | |
| 6,323,097 B1 | 11/2001 | Wu et al. | |
| 6,324,674 B2 | 11/2001 | Andreev et al. | |
| 6,324,675 B1 | 11/2001 | Dutta et al. | |
| 6,349,403 B1 | 2/2002 | Dutta et al. | |
| 6,408,427 B1 | 6/2002 | Cong et al. | |
| 6,412,097 B1 | 6/2002 | Kikuchi et al. | |
| 6,448,591 B1 | 9/2002 | Juengling | |
| 6,480,993 B1 | 11/2002 | Suto et al. | |
| 6,480,996 B1 | 11/2002 | Aji et al. | |
| 6,507,941 B1 | 1/2003 | Leung et al. | |
| 6,510,545 B1 | 1/2003 | Yee et al. | |
| 6,516,455 B1 | 2/2003 | Teig et al. | |
| 6,526,555 B1 | 2/2003 | Teig et al. | |
| 6,543,043 B1 | 4/2003 | Wang et al. | |
| 6,564,366 B1 | 5/2003 | Marchenko et al. | |
| 6,598,215 B2 | 7/2003 | Das et al. | |
| 6,645,842 B2 | 11/2003 | Igarashi et al. | |
| 6,662,348 B1 | 12/2003 | Naylor et al. | |
| 6,671,859 B1 | 12/2003 | Naylor et al. | |
| 6,711,727 B1 | 3/2004 | Teig et al. | |
| 6,734,472 B2 | 5/2004 | Ho | |
| 6,895,567 B1 | 5/2005 | Teig et al. | |
| 7,065,729 B1 * | 6/2006 | Chapman | 716/129 |
| 7,114,142 B1 | 9/2006 | Segal | |
| 7,373,628 B1 * | 5/2008 | Balsdon et al. | 716/129 |
| 7,530,040 B1 * | 5/2009 | Balsdon et al. | 716/129 |
| 2001/0004763 A1 | 6/2001 | Kato | |
| 2001/0009031 A1 | 7/2001 | Nitta et al. | |
| 2002/0069397 A1 | 6/2002 | Teig et al. | |
| 2003/0025205 A1 | 2/2003 | Shively | |
| 2005/0240893 A1 | 10/2005 | Teig et al. | |

OTHER PUBLICATIONS

Ng, "A 'Gridless' Variable-Width Channel Router for Macro Cell Design", 24th Conference on Design Automation, May 28-Jun. 1, 1987, pp. 633-636.

Dubois et al., "New Advances in the Routing of Mixed Analog and Digital Channels", IEEE International Symposium on Circuits and Systems, vol. 4, Jun. 11-14, 1991, pp. 1956-1959.

Polk, "A Three-Layer Gridless Channel Router with Compaction", 24th Conference on Design Automation, May 28-Jun. 1, 1987, pp. 146-151.

Chen et al., "Glitter: A Gridless Variable-Width Channel Router," IEEE Transactions on Computer-Aided Design of Integrated Circuits and Systems, vol. 5, No. 4, pp. 459-465.

\* cited by examiner

AUTOMATICALLY ROUTING NETS ACCORDING TO CURRENT DENSITY RULES

CROSS-REFERENCE TO RELATED APPLICATIONS

This application is a continuation of U.S. patent application Ser. No. 11/383,658, filed May 16, 2006, which is a divisional of U.S. patent application Ser. No. 10/709,843, filed Jun. 1, 2004, which are incorporated by reference along with other cited references in this application.

BACKGROUND OF THE INVENTION

The present invention relates to the field of electronic design automation for integrated circuits, and in particular, to the area of automatic routing of nets or interconnect taking into account current density.

Integrated circuits are important building blocks of the information age and are critical to the information age, affecting every industry including financial, banking, legal, military, high technology, transportation, telephony, oil, medical, drug, food, agriculture, education, and many others. Integrated circuits such as DSPs, amplifiers, DRAMs, SRAMs, EPROMs, EEPROMs, Flash memories, microprocessors, ASICs, and programmable logic are used in many applications such as computers, networking, telecommunications, and consumer electronics.

Consumers continue to demand greater performance in their electronic products. For example, higher speed computers will provide higher speed graphics for multimedia applications or development. Higher speed internet web servers will lead to greater on-line commerce including on-line stock trading, book sales, auctions, and grocery shopping, just to name a few examples. Higher performance integrated circuits will improve the performance of the products in which they are incorporated.

Large modern day integrated circuits have millions of devices including gates and transistors and are very complex. As process technology improves, more and more devices may be fabricated on a single integrated circuit, so integrated circuits will continue to become even more complex with time. To meet the challenges of building more complex and higher performance integrated circuits, software tools are used. These tools are in an area commonly referred to as computer aided design (CAD), computer aided engineering (CAE), or electronic design automation (EDA). There is a constant need to improve these electronic automatic tools in order to address the desire to for higher integration and better performance in integrated circuits.

Within an integrated circuit, there are devices, such as transistors, and interconnect. Interconnect is used to connect signals between the circuitry and also to supply power to the circuitry. Interconnect may include metal lines, polysilicon lines, polysilicide lines, or other conductive materials. Interconnect is also sometimes referred to as nets. There may be more than one layer of interconnect, such as metal-1 and metal-2 layers. There is a need for a technique of automatically routing the interconnect of an integrated circuit. Automatic routing will automatically connect the inputs of particular devices or circuits to the appropriate inputs, typically from other circuits or devices, or from the pins of those devices.

Furthermore, when automatically routing the interconnect, it is desirable to consider the current or power handling of the particular interconnect line. Certain lines will carry larger currents than other lines. It is desirable that the interconnect lines can carry the current or power they will potentially see during operation, otherwise problems such as electromigration, IR voltage drop, or self-heating will reduce the reliability, longevity, or performance of the integrated circuit.

Therefore, there is a need for an electronic design automation technique of automatically routing interconnect while taking into consideration current handling of the interconnect.

BRIEF SUMMARY OF THE INVENTION

This invention provides a technique to automatically route interconnect while taking into consideration current density rules. In an implementation, the technique uses a shape-based approach where a grid is not used. Based on input data including current density and frequency of each net, this technique determines the current requirements for each net. In a specific implementation, a Steiner tree is created for a net, and using this tree, the technique proposes route paths. The technique widens nets having greater current requirements. Adjacent wiring may be pushed aside to create sufficient space for wider nets.

In one embodiment, the invention is a method including providing a number of pins routed together on a net, where each pin has a current value, calculating a current requirement for each track segment of the net, and determining a track width for each track segment using a current density function. An automated routing of a first track segment of the net is performed, where the automatically routed first track segment has a track width as previously determined using the current density function.

In another embodiment, the invention is a method including providing a gridless layout of a circuit design, providing a number of pins of the gridless layout to be routed together using a net, and providing a track width for each track segment of the net. An automated routing of a first track segment of the net in the gridless layout is performed, where the automatically routed first track segment has a first track width as provided.

In another embodiment, the invention is a method including providing a number of pins of a layout to be routed together using a net, creating a Steiner tree for the net including a rule to treat a segment of the layout represented as a number terminal connected to each other, where these connections cannot be broken during automated routing, and providing a track width for each track segment of the net. Using the Steiner tree, an automated routing of a first track segment of the net in the gridless layout is performed, where the automatically routed first track segment has a first track width as provided.

This rule may be replaced with one or more other rules, and these rules may be combined with one another in any combination. Other examples of rules include: A rule is that for shaped items, points at the center and around the perimeter where the perimeter intersects a Hanan grid are added. A rule is that all points belonging to the same subnet will be connected together, so the automated routing will not attempt to disconnect these points. A rule is that for subpins in the same group that are not connected by an arc, the points for each pin will be replaced by a single point at the center of the subpin. A rule is that for subpins that are connected by an arc, both pins will be represented as connected by a forced connection. A rule is that buried pins are represented by a point outside a blockage where a first legal routing pitch would be. A rule is that a MOS transistor is modeled where its gate is single pin.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
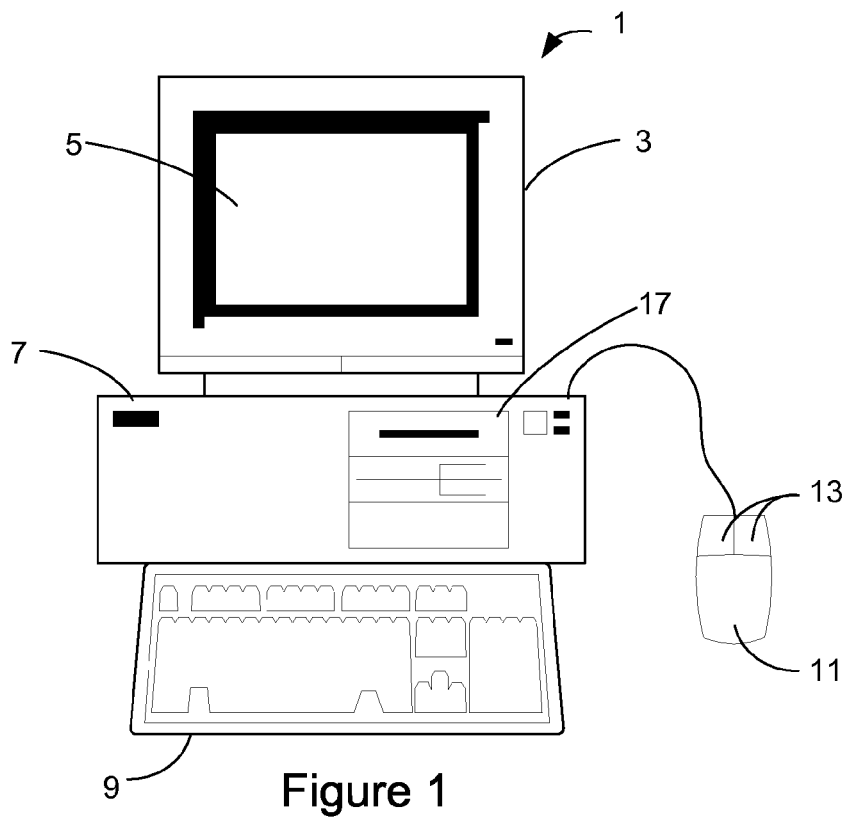
FIG. 1 shows a system of the present invention for performing electronic circuit design, including automatic interconnect routing according to current density rules.

FIG. 1 shows an electronic design automation (EDA) system of the present invention for designing an electronic circuit or integrated circuit, including routing of nets of the circuit according to current density rules. In an embodiment, the invention is software that executes on a computer workstation system, such as shown in FIG. 1. FIG. 1 shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor, memory, mass storage devices 17, and the like. Mass storage devices 17 may include mass disk drives, floppy disks, Iomega ZIP™ disks, magnetic disks, fixed disks, hard disks, CD-ROMs, recordable CDs, DVDs, recordable DVDs, Flash and other nonvolatile solid-state storage, tape storage, reader, and other similar media, and combinations of these. A binary, machine-executable version, of the software of the present invention may be stored or reside on mass storage devices 17. Furthermore, the source code of the software of the present invention may also be stored or reside on mass storage devices 17 (e.g., magnetic disk, tape, CD-ROM, or DVD).

Figure 2:
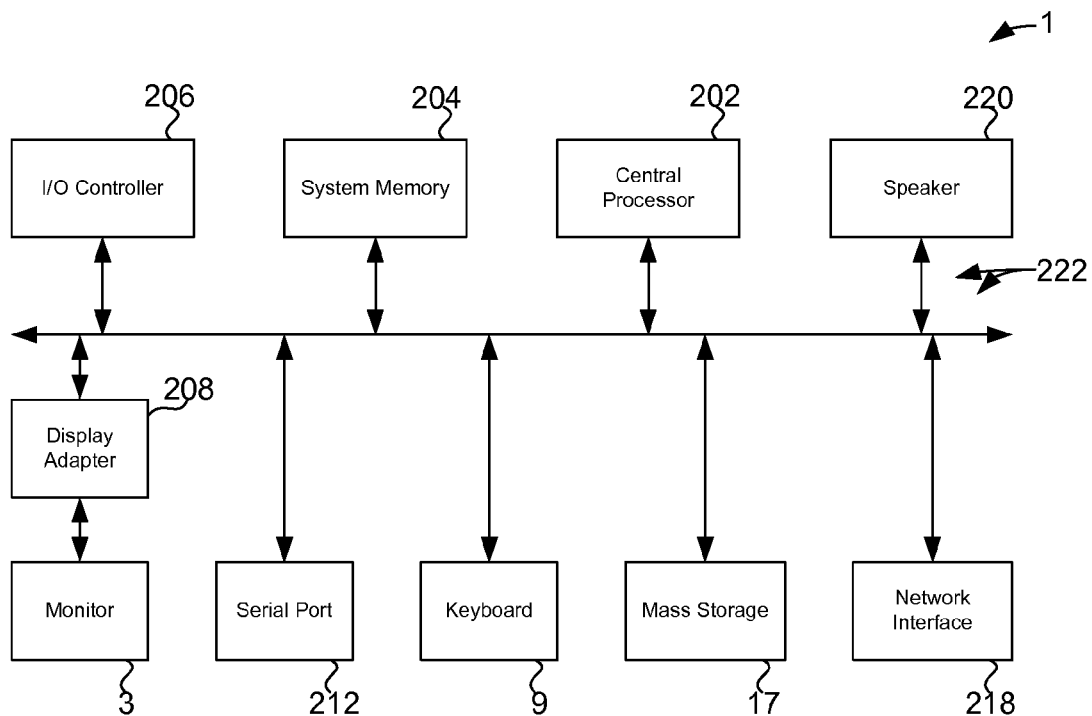
FIG. 2 shows a simplified system block diagram of computer system 1 used to execute the software of the present invention.

Further, FIG. 2 shows a system block diagram of computer system 1 used to execute software of the present invention. As in FIG. 1, computer system 1 includes monitor 3, keyboard 9, and mass storage devices 17. Computer system 1 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

Arrows such as 222 represent the system bus architecture of computer system 1. However, these arrows are illustrative of any interconnection scheme serving to link the subsystems. For example, speaker 220 could be connected to the other subsystems through a port or have an internal direct connection to central processor 202. Computer system 1 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks, www.mathworks.com), SAS, SPSS, and Java. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems). An operating system for the system may be one of the Microsoft Windows® family of operating systems (e.g., Windows 95, 98, Me, Windows NT, Windows 2000, Windows XP), Linux, UNIX, or Sun OS. Other operating systems may be used.

Furthermore, the computer may be connected to a network and may interface to other computers using this network. For example, each computer in the network may perform part of the task of the many series of automatic routing steps in parallel. Furthermore, the network may be an intranet, internet, or the Internet, among others. The network may be a wired network (e.g., using copper), telephone network, packet network, an optical network (e.g., using optical fiber), or a wireless network, or any combination thereof. For example, data and other information may be passed between the computer and components (or steps) of a system of the invention using a wireless network using a protocol such as Wi-Fi (IEEE standards 802.11, 802.11a, 802.11b, 802.11e, 802.11g, and 802.11i, just to name a few examples). For example, signals from a computer may be transferred, at least in part, wirelessly to components or other computers.

Figure 3:
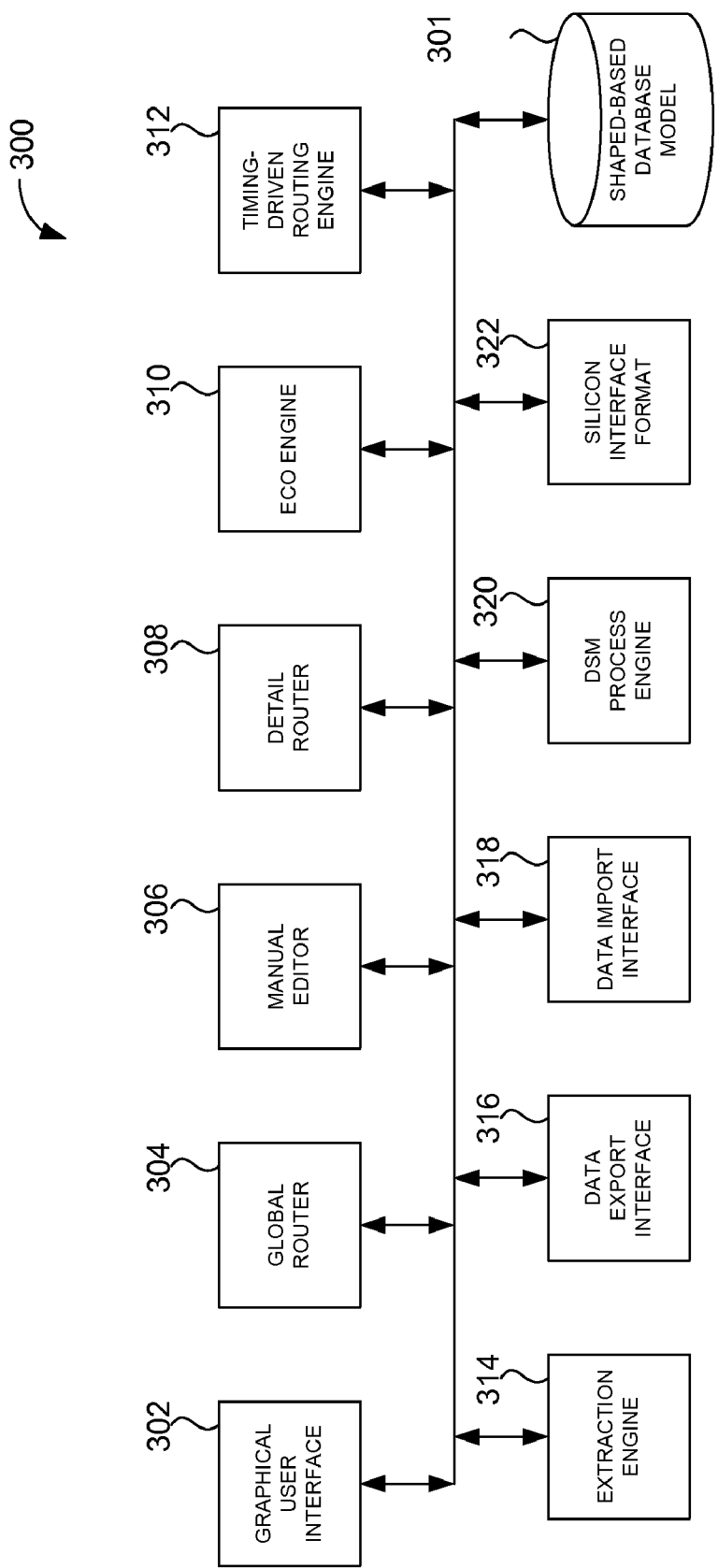
FIG. 3 shows a simplified functional block diagram of an exemplary EDA system incorporating aspects of the present invention.

FIG. 3 shows a simplified functional block diagram of an exemplary EDA system 300 incorporating aspects of the present invention. The EDA system includes a number of software tools, any of which may access a shaped-based database model 301 containing an integrated circuit design, or one or more portions of an integrated circuit design. The EDA system provides such tools as a graphical user interface 302, global router 304, manual editor 306, detail router 308, engineering change option (ECO) engine 310, timing-driven routing engine 312, extraction engine 314, data export interface 318, DSM process engine 320, and silicon interface format 322. An EDA system may include any number of the system tools shown in FIG. 3, and in any combination. Further, the EDA system may include additional tools not shown in FIG. 3.

An EDA system may be a grid-based system or shape-based system. Techniques of the present invention may be applied to a gridded or shape-based EDA system. A grid-based system relies heavily on the concept of a grid and routing grids. Gridded modeling, however, becomes difficult to implement successfully as the routing and feature sizes become smaller. The amount of data increases according to a square law, which means that tasks become increasingly more computationally complex and time-consuming as the amount of data increase. As feature sizes in integrated circuits continue to shrink, more features or geometries may be fitted into the same unit area of an integrated circuit. Therefore, it is important for an EDA system to handle increasingly complex integrated circuits and provide output or results quickly.

The techniques of the invention are especially suited for a shaped-based system, which may also be referred to as a gridless system. A shape-based system has no defined cell size. Each cell, or expansion area, is as large as possible. In brief, a shape-based system can expand edges, which means that an edge of an enclosing rectangle (or other polygon) may be expanded in the direction of the edge as far as desired until the edge finds an obstacle. This may be referred to as a "flood" operation. The rectangle may be representative of any polygon of the integrated circuit, such as a net, contact, via, transistor gate, or transistor active area. Blocked edges are edges that cannot be extended because they are blocked by a perimeter of another rectangle, such as another segment, net, or obstacle. Once an obstacle is encountered, then a shape-based approach floods around the obstacle—making a ninety degree or other angle (any angle may be used) turns as needed to route around the obstacle.

Chip design, be it analog, custom or digital, will increasingly suffer from timing and signal integrity issues, and in particular crosstalk, as geometries continue to decrease and ever more fine wires are introduced. Gridded solutions are not flexible enough to resolve these issues, let alone achieve a high rate of routing completion. A high performance timing and crosstalk-driven routing solution will become a mandatory requirement in physical design. The grid-based approach offers fast routing but requires customization to handle off-grid connections and is inefficient for postroute timing and signal integrity optimizations. When net widths and spacings must be changed to reduce resistance or cross-talk, grid-based approaches waste space by moving nets to the next available grid and waste time by resorting to rip-up and re-route techniques. Gridded systems are not good at irregular intervals, irregular spacings, or routing things that do not fit onto a regular grid. The gridless approach easily handles off-grid connections and is efficient for postroute optimizations. In a shape-based or gridless system, the layout may be a gridless layout, which means there is no grid which structures or polygon of the layout are associated with.

In an embodiment, the structure of database 301 facilitates shape-based operations. For example, a structure of this database may include an obstacle tree having nodes and leaves containing the obstacles of an integrated circuit. This tree structure permits rapid determination of where obstacles are when doing operations on the database, such as routing nets.

An specific example of an electronic design automation system is the Lyric Physical Design Framework™, made by Pulsic Ltd. Lyric is a high performance auto-interactive IC physical design solution for analog, custom, mixed-signal, embedded DRAM or SRAM, and system-on-chip (SoC) design. The system incorporates solutions for automatic placement, routing, full ECO capabilities, timing closure, signal integrity, and power routing. Another example of an EDA system is the Prelude Physical Design Framework™, also made by Pulsic Ltd. Prelude is an ultra high capacity, high performance IC physical design solution for very large digital/ASIC designs, running into millions of nets and cells. Prelude incorporates solutions for ECO placement and routing, powered by a scalable architecture, using a true distributed computing environment.

In FIG. 3, the EDA system 300 includes one or more of the components discussed below, in any combination. One skilled in the art will recognize that one or more of components shown in FIG. 3 may not be required to practice specific aspects of present invention. For example, when DSM process engine 320 is omitted from system, the system could still perform automatic routing of interconnect, but without providing DRC checking capabilities.

A graphical user interface 302 provides users a graphical interface in which to perform operations on the integrated circuit design. For example, the user can view the integrated circuit using the graphical interface. The user may use the mouse and cursor to select a particular polygon or feature, such as a net. The user may expand or zoom into areas of the integrated circuit design.

A global router 304 is an automatic routing engine that coarsely routes interconnects of the integrated circuit, thus enabling large designs to be routed more rapidly and completely. The global router may also provide visual and quantitative analysis of the congestion in the design by highlighting problem areas that can be fixed by incremental adjustments to the floor plan. The global router is sometimes referred to as a coarse router because it provides generally the routes for the interconnect, and may work in conjunction with a detail router 308 (discussed below) to place the geometries of the interconnect.

A manual editor 306 is a shape-editing suite for creating or editing metal, keep-outs, routing areas, and the ability to partition a design into smaller areas. These areas can then be worked upon individually and can be recombined at a later stage to complete the design. Full on-line design rule checking (DRC) ensures that manual operations are completed error-free first time. Powerful tools automatically push-aside existing wiring to make way for new wires and semiautomatic routing tools quickly close down troublesome nets by allowing the user to guide the routing engine around complex areas of the design.

The detail router 308 is an automatic router that completes the wiring in a design by determining the specific routes for each interconnect. The detail router may complete a portion of the wiring for design, such as for sections or specified cells of the design, or may complete all the wiring of the design. The detail router may route starting from scratch or from partially completed routing. In an implementation, the global router determines the general route paths for the interconnect, and the detail router takes this routing information from the global router and puts in the physical detailed geometries of the tracks and vias.

An ECO engine 310 provides a capability to handle late stage ECO changes. Every element of the design can be modeled incrementally, thus eliminating the need to ever restart the physical design, no matter what changes may need to be made from upstream or downstream processes in the design. ECO engine capabilities can include the ability to shove or push cells aside to make space for new or relocated instances, and the ability to drop groups of components and automatically find legal placement sites for them minimizing the disruption to the design. When pushing or pulling cells, the wires remain connected to the cells and the wires lengthen, shorten, and move as needed, if possible, to keep the connections. The detail router can then repair any violating interconnects and stitch-up any newly introduced interconnects, with minimum impact, ensuring circuit stability is never compromised.

A timing-driven routing engine 312 provides RC timing analysis of interconnects. Used in concert with the detail router, the timing engine can determine the path of least delay for critical nets. Furthermore, the timing engine, in concert with an extraction engine, can actively select a longer path with a lower associated delay (e.g., due to lower capacitance) in preference to a shorter but slower route.

An extraction engine 314 is provided. Utilizing a unified, high-speed RC extraction engine, the crosstalk functionality accurately calculates the coupling between victim and aggressor signals. This same technology is then used to identify potential problems, and automatically implements a DRC correct solution without changing the path of the signal unnecessarily. In addition, signal-to-signal (or within and between classes of signals) spacing rules can be applied, and fully controllable automatic shielding can be used to protect particularly sensitive signals. The user is provided with unprecedented control over the resistance and capacitance in the signal path. Again, using the advanced built-in RC extraction technology, the user can separately control path resistance and capacitance, which is particularly useful for analog and mixed signal design.

In an implementation, the global router and detail router are linked to the extraction engine. So, for example, when running, the global router or detail router, or both, can call the extraction engine to obtain RC extraction information. The global router, detail router, or both, may use the RC extraction information when creating the interconnect routes. For example, the detail router may obtain RC extraction info from the RC engine in order determine whether an interconnect route meets current density rules, and widen the interconnect width as needed.

In a specific embodiment, the Lyric internal RC extraction driven constraints manager has been enhanced to ensure matching on a per-layer basis as well as the whole net or subnet. There is an increasing requirement in today's designs to match length, time, resistance and capacitance across nets on a per-layer basis. This ensures total net constraints are met as before but also guarantees designated nets can match on a per-layer basis.

The tightly coupled, high-speed RC extraction engine is used both during routing (global router or detail router, or both) and for postrouting extraction to reach timing closure in record time. Integrated timing analysis and curative features enable the management of delay within the design; the matching of delays within and between multiple nets; the sharing of delay between many nets in a signal path; and reducing the delay in critical nets by minimizing resistance and capacitance. Intelligent lengthening increases the delay of the faster nets, preventing shoot-through.

The detail router can address current density issues in analog design, to help achieve an optimum routing result for the entire design, and save valuable design time. The current information which is used to drive this current density functionality may come from, for example, a front-end schematic engine or simulation engine. The router can automatically route a net at varying widths to guarantee sufficient track widths at every point in the topology of the net to carry all current requirements. DRC and process checking tools locate any insufficient width areas that may exist in any routing, including automatically generated routing, manual routing, and imported prerouting.

A data export interface 316 is provided so data of the EDA system 300 may be exported for other processes. For example, output from the EDA system may be passed through the export interface to other EDA systems or software tools provided by other manufacturers. The export interface would provide output in a form, format, or structure, acceptable by process or software tool which is being exported to.

A data import interface 318 provides the means to import data, such as a circuit layout, netlist, or design constraints. The data to be import may be in various formats including data saved from other EDA systems or software tools. In addition, the source of the data may be a database, floppy drive, tape, hard disk drive, CD-ROM, CD-R, CD-RW, DVD, or a device over a communication network. Some example of import formats include text, ASCII, GDSII, and LEF/DEF.

A DSM process engine 320 is provided. The DSM process engine does design rule checking (DRC). Design rule checking locates and highlights where a design is breaking process design rules. For example, a design rule is the minimum spacing between metal lines (i.e., geometries on a specific layer). A design rule may be the minimum width of a metal line. A design rule may be a minimum polysilicon-to-diffusion spacing. There are many other design rules for a typical process. Some design rules are for checking geometries within a single layer, and some design rules are for checking geometries of two or more layers.

A silicon interface format 322 is provided, which in a specific implementation is an ASCII database format. However, in other implementations, other silicon interface formats may be used.

A user may design an integrated circuit using a system such as shown in FIG. 3. A representative flow for designing an integrated circuit is outlined in steps 1 to 8 below in flow A. Step 5 is further subdivided into three substeps.

Flow A

Integrated Circuit Design Flow
1. Provide Circuit Specification
2. Create Circuit Design
3. Generate Netlist
4. Simulate Performance and Verify Functionality of Circuit Design
5. Generate Layout
  5a. Layout Devices
  5b. Connect Devices
  5c. Connect Blocks of Circuitry
6. Physical Verification and Design Checking
7. Create Masks
8. Fabricate Integrated Circuit Although the steps above are listed in a specific order, the steps may take place in any order, as desired and depending on the specific application. These are general steps that may be applied to designing an integrated circuit including custom, a gate array, standard cell, field programmable logic, microprocessor, digital signal processor, microcontroller, system-on-a-chip (SOC), memory, ASIC, mixed signal, analog, radio frequency (RF) or wireless, and others. There may be additional or other steps, which may replace one or more above steps. Certain steps may be repeated. For example, after generating a layout for a circuit design, the step of simulating performance and verifying functionality may be performed again. This time, the parasitics and RC considerations from the layout can be back-annotated into the netlist or circuit design, and the design simulated again. The results of this simulation will presumably be more accurate because more precise information is provided.

In step 1 of the flow, a circuit specification is provided. This is a specification or description of what the integrated circuit or circuit will do, and what the performance will be. For example, the integrated circuit may be a memory integrated circuit with particular address input pins and input-output (I/O) pins. Integrated circuit performance may be quantified terms in AC and DC performance. For example, AC performance refers to propagation delays, maximum clock frequency, clock-to-output delay, hold time, and other similar parameters. DC performance refers to maximum supply current, maximum and minimum supply voltage, output current drive, and other similar parameters.

In step 2, an engineer creates a circuit design that presumably will meet the circuit specification. This circuit design may include transistors, resistors, capacitors, and other electronic components. The engineer uses these electronic components as building blocks of the design, interconnecting them to achieve the desired functionality and performance. The engineer may make a custom design using electronic component building blocks or use a gate array, where the building blocks are sets of cells set by the gate array manufacturer. The design may be input using a graphical design tool such as schematic capture program, and any other design tool may be used. The circuit may be described using a high-level design language (HDL). These design tools will create a netlist (step 3) of the circuitry, which is a listing of the components of the devices and their interconnections.

During the design phase, the engineer simulates the performance and verifies the functionality of the circuitry (step 4). There are transistor and process models to model the components. Some simulation tools include Spice, which performs circuit simulation, and Verilog, which performs functional and timing verification. This is where the electrical information for current density routing is generated.

After deciding upon an initial circuit design, the engineer begins layout (step 5) of the circuitry. Layout refers to making the three-dimensional dispositions of the element and interconnections to make an integrated circuit. Making an integrated circuit is a layer by layer process. Some layers of an integrated circuit are diffusion, polysilicon, metal-1, metal-2, contact, via, and others. There may be multiple layers of the same material, but on different layers. For example, diffusion and polysilicon layers are used to make MOS transistors (step 5a). For example, metal-1 and metal-2 are two different layers, where metal-1 is below the metal-2 layers. These metal layers may be connected together using a via. Metal is typically used for interconnections (step 5b) and supplying power and ground to the devices.

Software tools may be used to help with the layout of the circuit, such as the automatic routing of interconnect (steps 5b and 5c). The interconnect may be between devices. Devices and circuitry may be grouped into blocks or cells having inputs and outputs. The interconnect may be between these blocks or cells (step 5b).

In step 6, after or while the layout is generated, the physical design is verified and checked. For example, some of these operations may include layout-versus-schematic (LVS) checking, electrical rule checking (ERC), design rule checking (DRC), layout simulation (especially for analog circuitry), power analysis, and timing analysis. Physical verification and design checking is often iterative. Based on the design check, a design engineer or user may make changes to the design or layout, or both and the design may be rechecked in order to make sure any areas of concern or design errors have been cleared.

The result of layout is data (e.g., provided in GDSII or other format) that is used to make the masks (step 7). The masks are used to fabricate the integrated circuit (step 8) using a photolithography process. Typically, there are many "copies" of the same integrated circuited fabricated on the same wafer. Each integrated circuit is a "die" on the wafer. Good dies are separated from the bad dies. The good dies are sawed and packaged. Packaging generally includes encapsulating the die in plastic or other material, and connecting pads of the integrated circuit to pins of the package, where the integrated circuit can be interfaced.

The invention provides techniques to automatically route nets according to current density rules. The invention would help with steps 5b and 5c (routing interconnect) of the design process.

There are several effects that can cause reliability or performance problems due to currents flowing in wires within an integrated circuit. One potential problem is electromigration. At high current densities, such as when the value of current divided by cross sectional area of a wire is large, electrons become accelerated to a level where they can displace atoms from the crystal lattice of the metal wire. Over time this can lead to voids in the wire and ultimately an open circuit can form. Furthermore, the displaced atoms may leave the body of the wire altogether and form spurs at corners in the wire, leading to short-circuits with other neighboring electrical signals. Both opens and shorts lead to functional errors. This effect gets worse with time and hence can cause failures in the field a considerable time after manufacture. The wider a wire, the lower the current density will become.

Another potential problem is IR voltage drop. Due to Ohm's law, a current flowing throw a resistance (a resistance in this case is a narrow wire) will create a potential difference, and in the case of an electronic circuit this invariably means that the voltage of a signal will become degraded. This may mean that logic transitions fail to cross thresholds, or take longer to do so, or that noise will cause false transitions, or in an analog circuit the signal-to-noise ratio will be reduced. This will reduce functional yield and may cause failures in the field. The wider a wire is, then the lower the resistance and hence the lower the voltage drop.

Another potential problem is self-heating. Current flowing through a resistance (a resistance in this case is a narrow wire) generates heat ($I^2R$). This heat will generally slow down circuit operation (as transistor characteristics get worse at raised temperature), and if localized can cause mismatches in analog circuitry or clocking structures and thus generate functional errors. This will reduce functional yield and may cause failures in the field. The wider a wire is, then the lower the resistance and hence the lower the temperature. Another potential problem from self-heating is that with sufficient current and heat, an interconnect may be like a unintended fuse and can burn out. This would create an open circuit, which may also cause functional problems.

For most signals, the minimum width wire allowed by design rules is sufficient to avoid these problems because the current involved is low and transitory. But for analog nets, power supplies, clocks and other high-drive digital signals—one or more of the effects may cause concern. The design rules are a set of guidelines that are followed when laying out the integrated circuit. The design rules are generally provided by the process engineers or foundry.

It is inefficient to set all segments of the routing of such nets to a large width, or even the worst case width as this will take up an unnecessarily large part of the design area, hence increasing production costs.

One way to efficiently handle the current requirements of such nets while not using excessive real estate on the design space is to connect the devices on the net by hand, ensuring that each "section" of the net in the routed topology is sufficiently wide enough to handle the relevant pin current of the devices. The problem with this approach is that it is very time consuming and unreliable as the user will have to calculate the necessary widths for each section of the routed topology and ensure the sections are at such width. Also, invariably the hand-routed nets will have to be redone frequently to make way for other requirements, placement adjustments, congestion, ECO requirements, and so forth.

It is therefore desirable to automatically route the nets and automatically determine the minimum required width for each section of the routing of such nets, taking into account the relevant rules (electromigration, IR drop, and self-heating), as well as the characteristics of the individual net such as switching frequency, noise margin, pin currents, capacitance, and other characteristics.

Traditionally, automatic routers have no knowledge of and do not take into consideration current density rules. Traditionally, automatic routers take into consideration spacing rules when routing interconnect. Using a traditional automatic router, a user may make adjustments manually to account for current density rules. When using a traditional automatic router, some strategies may include: (a) route using the minimum track width, and manually apply a fattening postprocess, or (b) route using a larger track width for the whole net. A problem with (a) is that it may not be possible to fatten the routes by the necessary amount to meet the current density rules. A problem with (b) is that it is unlikely to be possible to route the design one hundred percent when using an artificially large track width for the whole net.

There is need for a technique of allowing the current density rules to be considered during the routing process itself that would result in a net being fully automatically routed at various differing widths to sufficiently handle the current densities at each section of the resultant topology. This strategy could be extended to determine track widths according to the resistance of the various paths on a net.

Input Data

Input data includes a current density function, where current density is given as a function of at least one of layer, net frequency, or track width, or all or any combination of these. There may be other factors that affect current density and these factors may also be part of the function. The current density function may be provided in the form of a formula, equation, table, look-up table, or any other technique for quantifying a current density relationship.

In a specific embodiment, the data to be used includes one or more current density tables and a frequency of each net. A current density table is a table providing the current density as a function of layer, net frequency, and track width. Such a table will enable a minimum track width to be determined, given a frequency, a layer, and a current requirement. In another specific implementation, the technique uses entries from the table. If current is higher than a particular value, then the next higher entry in the table is used. This approach provides a conservative value for the width of the interconnect, because the interconnect will be wide enough to handle the expected or calculated current. In another implementation, where a specific current requirements value is not found in the table, a current requirement value may be obtained by interpolating using entries available in the table.

For example, a linear interpolation technique may be used to determine a current requirement, where the frequency is between two different frequencies provided in the table. As a sample calculation, two entries in the table are (50, 10) and (40, 5), where for (M, N), M represents frequency and N represents current requirements. Then, then using linear interpolation, for a frequency of 45, the current requirement will be 7.5. For a frequency of 48, the current requirement will be 9 (i.e., (48−30)/2). Although this is an example of linear interpolation, other types of interpolation may be used including polynomial, exponential, logarithmic, and others.

A frequency of each net (where 0 is a DC net) is also provided as input. In an embodiment, when frequency information is not provided for a particular net, DC operation of the nets will be assumed. In another embodiment, when frequency information is not provided for a particular net, a warning message will be provided to the user. The user then can supply the frequency information.

The current requirements for a net changes as the frequency changes. The function of current density as a function of frequency is given in the current density table. For example, typically, as the frequency on a net increases, there is an increase in current or power requirements. The current associated with each device pin of relevant nets, where a +ve value indicates driver/source, and a −ve value indicates receiver or sink. Normally the sum of the currents of all the device pins on a net will be zero, but this is not essential.

Width Formula

The invention may use following width formula. The following describes how to determine the needed track width for a particular track segment on a routed net.

A net is the wire connecting all the points together. There may be many branches and segments in a single net. Each of the branches or segments may have different current requirements because there are inputs and outputs along the path, and current path gets divided up. A subportion of the net may be referred to as a track. Interconnect will be used to form the net in the integrated circuit design. And based on the current requirements for a track, a particular track width is selected and this width is used for the interconnect in the design.

Assume we have a net N, and a track segment T on layer L. Firstly, we need determine the current requirement C, for the track T.

Determine which pin on the net is the "main driver," i.e., the pin with the largest (positive) current. Having done this, we can determine which pins are downstream of track T. The current requirement C is the (absolute) sum of the current requirements of the downstream pins.

Figure 4:
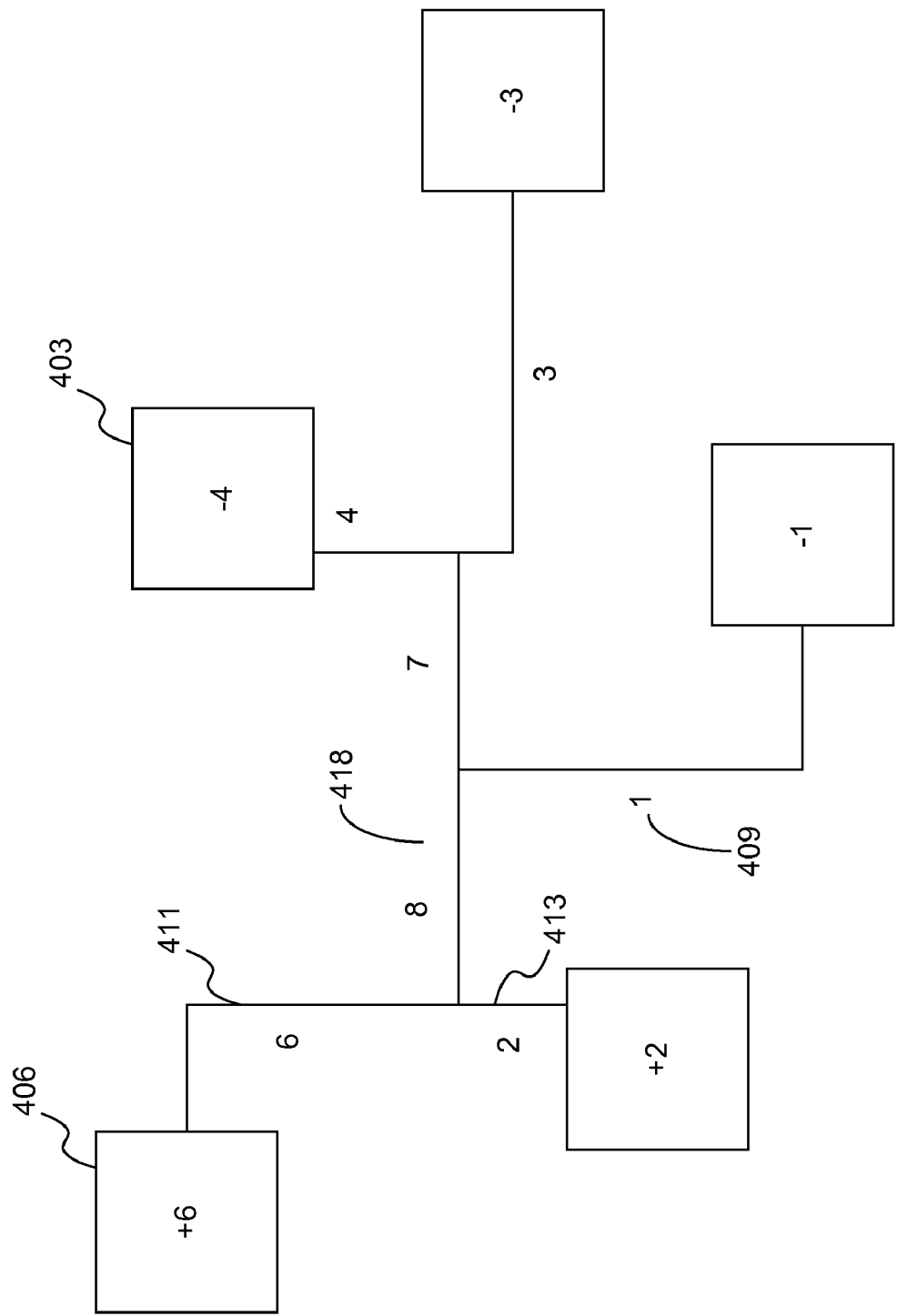
FIG. 4 shows an example of current requirement calculation for nets.

FIG. 4 shows an example of an application of a width formula of the invention. FIG. 4 shows nets and pins. Boxes 403 represent device pins with their associated pin current values. The +6 pin 406 will be treated as the main driver. The derived current 409 for the various paths are shown.

For example, a segment 411 provides a current of 6 while a segment 413 provides a current of 2. Therefore segment 418 handles current of 8, which is the sum of the currents on segments 411 and 413. These calculations provide the current requirements for those nets.

Having determined the current requirement for a particular track segment, we can now derive the corresponding track width. This calculation depends on the net frequency, the track layer, and current density tables. The actual currents may be less, but the width of the net will be wide enough to handle the provided current requirements.

Routing Technique

Given a routed net, it has been shown how it is possible to determine the current requirement of each route path. From this, we can determine the width requirement for each track. Any track that is deemed to be of insufficient width to support its current requirement can then be widened provided there is sufficient space, or that adjacent wiring can be pushed aside to create sufficient space.

An aspect of the invention is to allow the current density rules to be considered during the routing process. A key problem with this is that the precise routing topology of a net is not known in advance. Thus we do not know which pins are downstream of each potential track, and therefore we cannot derive the appropriate track widths to use.

A basic strategy or flow for solving this problem is to route nets with current density rules using Steiner trees. Flow B provides an example of pseudocode for such a technique of routing while considering current density rules.

Flow B

```
ROUTENET(N)
{
//form a set of points S to be connected for net N
//generate Steiner tree for S
//this will gives a new set of points S' and a set of links L between
//these points
//for each point in S' that was not in S
{
//create virtual pin
}
```

//rearrange the unrouted connections on N according to the Steiner
//links L
//for each unrouted connection C on N
{
//determine the current requirement A of this connection C
//this is done by finding the sum of the currents of all
//the downstream pins
//determine the track width per layer for C using
//the current requirement A, the net frequency, and the
//current density tables
//autoroute this connection with these track widths
}
}

Steiner Tree Creation

At the core of this strategy is the ability to create a Steiner tree for the net. A Steiner tree is a tree in a distance graph which spans a given subset of vertices (Steiner points) with the minimal total distance on its edges. In the seventeenth century, French mathematician Pierre Fermat asked how we could find a point P in a triangle with the distances from P to the vertices being as small as possible. This problem was later solved by Toricelli. The Steiner problem is a generalization of this question allowing for an arbitrary number of initial vertices and an arbitrary number of vertices to be added. Even more simply stated, the Steiner problem is to join a set of points with the smallest collection of connections. Steiner tree creation should be very efficient and will necessarily be a heuristic algorithm as Steiner tree creation is NP complete. Heuristic algorithms have been designed to approximate the result within polynomial time.

Various Steiner tree algorithms exist today. Mostly these are from academic research. One approach is referred to as the "batched greedy algorithm" (BGA), worked on by Kahng, Mandiou, and Zelikosky. However, in other implementations of the invention, other Steiner tree algorithms may be used including Prim's algorithm and Kruskal's algorithm. Prim's algorithm is an algorithm to find a minimum spanning tree. The steps for Prim's algorithm are:

1. Set i=0, S0={u0=s}, L(u0)=0, and L(v)=infinity for v<>u0. If |V|=1 then stop, otherwise go to step 2.
2. For each v in V\Si, replace L(v) by min{L(v), dv ui}. If L(v) is replaced, put a label (L(v), ui) on v.
3. Find a vertex v which minimizes {L(v): v in V\Si}, say u(i+1).
4. Let S(i+1)=Si cup {u(i+1)}.
5. Replace i by i+1. If i=|V|−1 then stop, otherwise go to step 2.

The time used by Prim's algorithm is O(|V|^2). It will be reduced to O(|E|log|V|) if heap is used to keep {v in V\Si: L(v)<infinity}.

Kruskal's algorithm is another algorithm to find a minimum spanning tree. The steps for Kruskal's algorithm are:

1. Set i=1 and let E0={ }
2. Select an edge ei of minimum value not in E(i−1) such that Ti=<E(i−1) cup {ei}>is acyclic and define Ei=E(i−1) cup {ei}. If no such edge exists, let T=<Ei>and stop.
3. Replace i by i+1. Return to Step 2.

The time used by Kruskal's algorithm is O(|E|log|V|).

For an implementation of the invention, a Steiner tree algorithm is used where improvements are made to the batched greedy algorithm. This improved batched greedy algorithm is highly scalable and in tests is able to find a near optimal solution for 35,000 terminals in 24 seconds compared to several hours or days for other heuristic algorithms.

The standard batched greedy algorithm has some limitations that are addressed by the improved approach of the invention. Some limitations of the standard batched greedy algorithm that are addressed by the invention include:

1. The standard batched greedy algorithm works on idealized points not arbitrary shapes|e.g., prerouting, and so forth.
2. The standard batched greedy algorithm does not consider electrically equivalent points.
3. The standard batched greedy algorithm does not consider routing obstacles.

New Batched Greedy Algorithm for Prerouting and Large Shapes

Because the standard batched greedy algorithm does not consider rectangles or anything more complicated than points, we improve the algorithm to handle with these real world items.

In an approach of the invention for the purposes of batched greedy algorithm, preroutes are deconstructed to a number of points and that the batched greedy algorithm is modified to consider forced connections. Therefore a segment (or number of segments) could be represented as a number of terminals which are already connected to each other and whose connections cannot be broken.

In the case of a track these points will be placed at the ends of the segment and at the intersection of the track with the lines of a Hanan grid. A Hanan grid is an induced grid which is formed by drawing vertical and horizontal lines through the points. By imposing a Hanan grid, this restricts the feasible solution search space to a finite collection of trees. Hanan's classic result states that a shortest Steiner tree exists on the grid induced by the points.

For vias, it is only necessary to add a single point at the connections point. For shaped items, i.e., large pins and metal, points are added at the centre and around the perimeter where the perimeter intersects the Hanan grid.

All points that belong to the same subnet should be connected together so that the BGA algorithm will not attempt to disconnect them.

Figure 5:
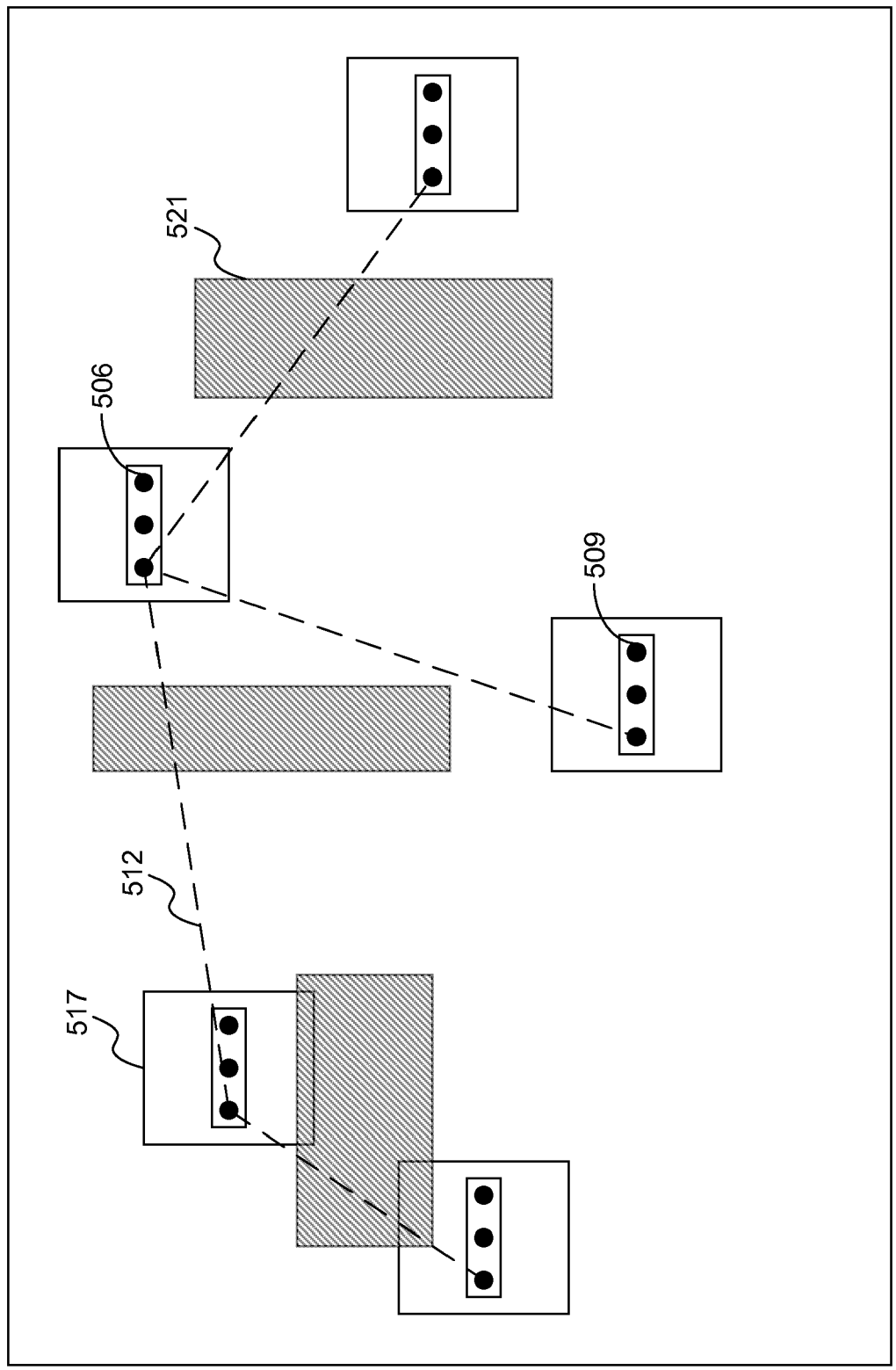
FIG. 5 shows an unrouted net with points.

FIG. 5 shows an example layout of an unrouted net showing points 506 on pins. Pins are indicated by shaded rectangles 509. In FIG. 5, there are five pins. Within the pins are deconstruction points 506 for the pins. Each of the pins of FIG. 5 has three deconstruction points each. There are dashed lines 512 connecting the pins; these dashed lines show the logical connections. Surrounding each pin is a rectangle 517, which is the cell outline. There are dark three rectangles 521 that are obstacles, which the interconnect cannot route through.

Figure 6:
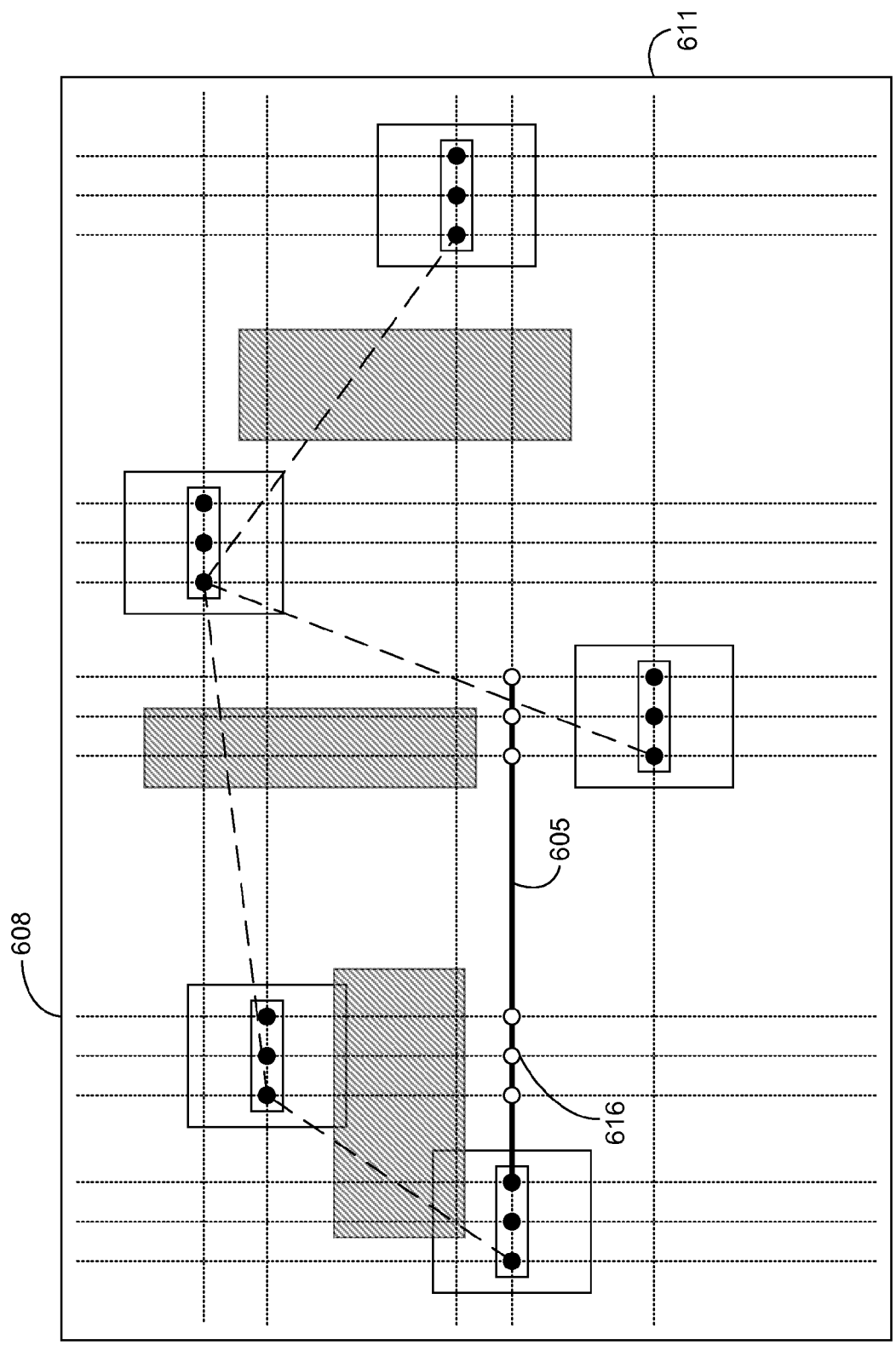
FIG. 6 shows prerouting of the net of FIG. 5.

FIG. 6 shows the net of FIG. 5 with prerouting 608. There is a Hanan grid with grid lines going vertically 608 and horizontally 611. There are projected points 616 on the prerouting 605. Where the Hanan grid and track intersect or cross each other, a deconstruction point is placed. Therefore, on prerouting track 605, there are six projected points 616, each occurring at an intersection with the Hanan grid. Prerouting is a term used for routing that already exists in a design—i.e., not created by any part of the tool, rather it has been imported along with the design into the tool.

Figure 7:
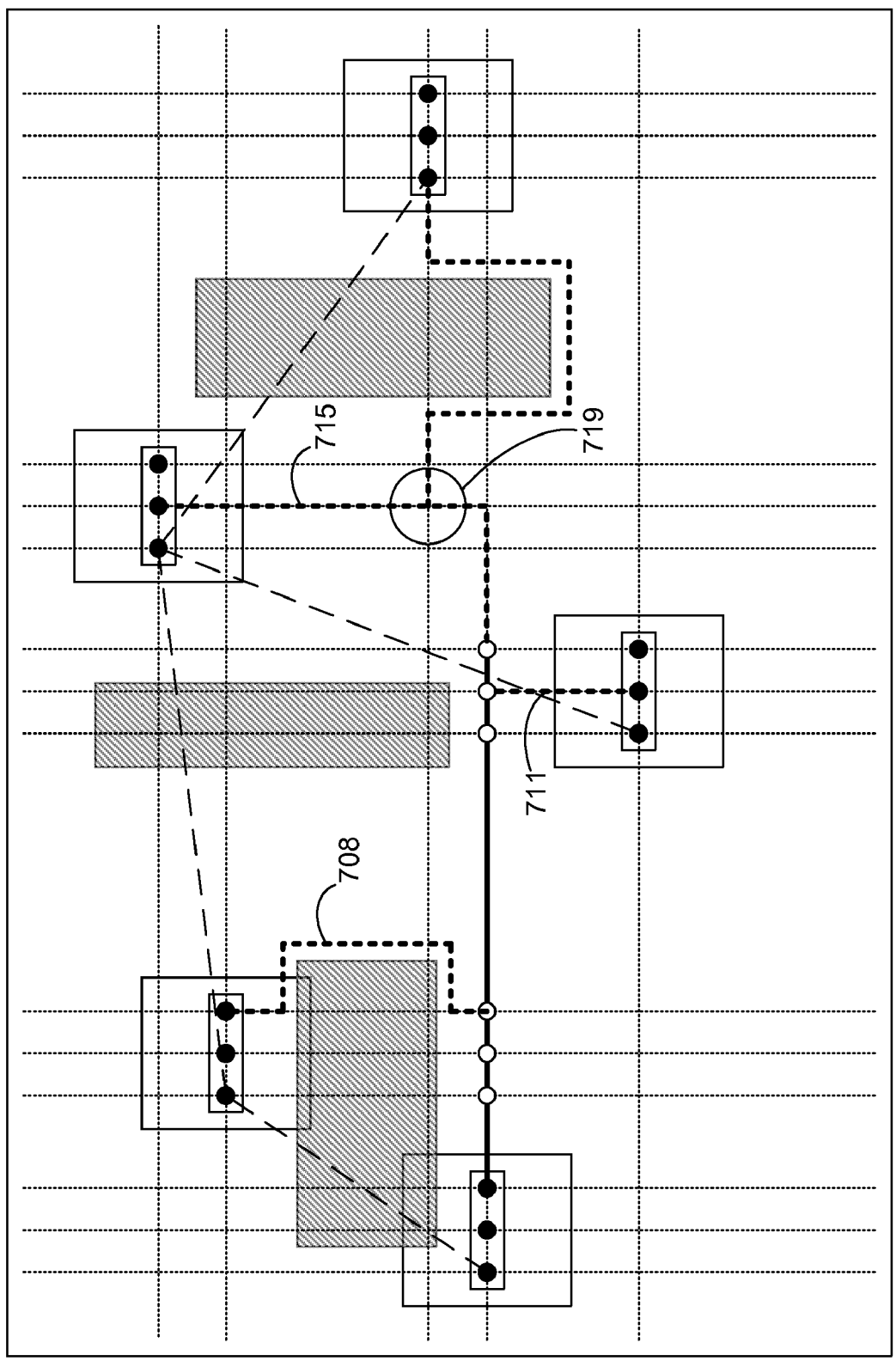
FIG. 7 shows proposed paths for the net obtained by Steiner tree creation.

The result of the Steiner tree includes the proposed paths and one or more virtual pins. The proposed path is shown in FIG. 7. Paths connecting at a virtual pin will guarantee the topology of the net, which means the current density will be guaranteed because there the width of the branch will be sufficient.

The position of the virtual pin is such that when defined in the topology of the netlist, it will define a branch point that is to be connected to by the paths from the pins, and all those paths connecting to the virtual pin can be widened sufficiently to meet the current requirements of the pins on those paths.

FIG. 7 shows proposed paths for routing a net. The proposed paths determined by Steiner tree creation are indicated by reference numbers 708, 711, and 715. A virtual pin is indicated by the reference number 719.

Technique for Electrically Equivalent Points

A single logical pin may have multiple subpins. These shapes may be internally connected, in which case only one of the subpins needs to be routed to, or they may not be internally connected in which case they all need to be routed to. All members of a subpin group are assumed internally connected sufficiently so that only one needs to be routed.

Separate subpin groups are assumed to have no internal connection, so each subpin group must have at least one routed pin. The connection between two subpins may be sufficiently strong so as to allow for through routing. In this case a subpin arc is defined between the two subpins.

Where a pin contains subpins that are electrically equivalent, then one of the two following approaches is used depending of the exact nature of the equivalence.

For subpins in the same group that are not connected by an arc then the points for each pin should be replaced by a single point at the centre of the subpins. After the Steiner tree has been constructed each such group will be visited in turn and the lowest cost subpin in each group will marked as the preferred subpin and other subpins will be marked unexitable. In this way once a preference for the top or the bottom of a cell row is established by the first group, other cells in the row are likely to follow resulting in a better routing pattern.

For subpins that are connected by an arc then both pins will be represented to batched greedy algorithm as connected by a forced connection in a similar way to prerouting, the batched greedy algorithm will then be able use the potential feed through.

Technique for Routing Obstacles

Many routing obstacles do not need to be considered in great detail. The two main types of routing obstacles that need consideration are:

1. Those obstacles, or combination of obstacles, that block all routing in a particular bias through an area or completely block all routing in a particular area.

2. Those obstacles that would prevent the placement of Steiner points (virtual pins).

The inner part of the batched greedy algorithm is changed to consider these obstacles when proposing potential routing structures. In an implementation, this is achieved by passing into the batched greedy algorithm a set of rectangles that represent routing obstacles along with the direction of routing blocked by each.

However this is likely to have an impact of the single point method for routing electrically equivalent points as many such subpins are either side of routing obstacles. So when routing between such pins by the batched greedy algorithm, the technique should ignore the routing obstacles if both points lie within the same contiguous region of the obstacle.

To ensure that there is not an explosion of these regions, only items that are bigger in the anti-bias dimension than a number of routing pitches will be considered (the number of pitches is to be found by experiment).

Other Considerations

Buried Pins

A buried pin is a pin that is fully enclosed by an obstacle. Buried pins should be treated slightly differently than other pins. Buried pins will be represented by a point just outside the blockage where the first legal routing pitch would be. In order to automatically route buried pins and consider current density rules, strict rules are used which allow obstacles to be ignored so buried pin may be routed in a strict way. More specifically, if the buried pin is near the edge of the obstacle, it may be routed directly through that edge. Therefore, as far as the Steiner tree is concerned it is better modeled as a point outside the obstacle.

CMOS Transistors

CMOS transistors, where the gate of a transistor has been modeled as a single pin and the middle is covered with an obstacle, should be represented as a single point in the middle on the pin. Then in a similar way to that of electrically equivalent pins each possible exit direction should be considered and the lowest cost edge preferred and other exit directions barred. This should encourage a routing pattern that connects multiple transistors along the same side.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:

providing a plurality of pins routed together on a net, wherein each pin has a current value, and the net has an associated frequency value;

using at least one processor, calculating a current requirement for each track segment of the net and taking into account the frequency value associated with the net;

determining a track width for each track segment using a current density function; and performing an automated routing of a first track segment of the net, wherein the automatically routed first track segment has a track width as previously determined using the current density function, and wherein the calculating a current requirement for each track segment of the net comprises:

finding a pin of the net with the largest current value and setting as a main driver pin;

setting the largest current value as a current requirement for a second track segment connected to the main driver pin, wherein the second track segment is connected to third and fourth track segments at one point; and setting a current requirement for a third track segment as a sum of the largest current value and a current requirement for the fourth track segment.

2. The method of claim 1 wherein the current density function is provided using a current density table comprising current density as a function of at least one of layer, net frequency, or track width.

3. The method of claim 1 wherein performing an automated routing of a first track segment of the net comprises using a Steiner tree algorithm.

4. The method of claim 1 further comprising:

generating a Steiner tree for the net.

5. The method of claim 1 wherein calculating a current requirement for each track segment of the net comprises:

providing a first pin having a first current value connected to a second track segment of the net;

providing a second pin having a second current value connected to a third track segment of the net, wherein the second and third track segments are connected;

setting the first current value as a current requirement for the second track segment;

setting the second current value as a current requirement for the third track segment;

providing a fourth segment connecting to the second and third track segments; and setting a sum of the first and second current values as a current requirement for the fourth track segment.

6. The method of claim 1 performing an automated routing of a second track segment of the net, wherein the automatically routed second track segment has a track width as previously determined using the current density function, and the track width of the second track segment is different from the track width of the first track segment.

7. The method of claim 1 wherein the net is provided in a gridless layout of an integrated circuit design.

8. The method of claim 1 wherein the net is provided in a gridded layout of an integrated circuit design.

9. The method of claim 1 wherein performing an automated routing of a first track segment of the net comprises:
providing pins of the net;
forming a grid based on positions of the pins;
finding a first route path to connect the pins using the grid; and
routing around an obstacle in the first route path using an unobstructed path, wherein the unobstructed path is not on the grid.

10. The method of claim 9 wherein forming a grid based on positions of the pins occurs after the pins are provided.

11. The method of claim 1 wherein the pins and net are in an integrated circuit design.

12. The method of claim 1 wherein the plurality of pins to be routed together reside within a single integrated circuit design.

13. The method of claim 1 wherein the net has three or more tracks coupled at a common code, and the calculating a current requirement for each track segment calculates at least three different values.

14. A computer program product stored on a non-transitory computer-readable storage medium, the computer program product comprising:
code for providing a plurality of pins routed together on a net, wherein each pin has a current value;
code for calculating a current requirement for each track segment of the net, wherein the net has three of more tracks coupled at a common node;
code for determining a track width for each track segment using a current density function; and
code for performing an automated routing of a first track segment of the net, wherein the automatically routed first track segment has a track width as previously determined using the current density function, and wherein the code for calculating a current requirement for each track segment of the net comprises:
code for finding a pin of the net with the largest current value and setting as a main driver pin;
code for setting the largest current value as a current requirement for a second track segment connected to the main driver pin, wherein the second track segment is connected to third and fourth track segments at one point; and
code setting a current requirement for a third track segment as a sum of the largest current value and a current requirement for the fourth track segment.

15. The computer program product of claim 14 further comprising:
code for providing a frequency of the net and the calculating a current requirement for each track segment of the net takes into account the frequency.

16. The computer program product of claim 14 wherein the plurality of pins to be routed together reside within a single integrated circuit design.

17. A system embodied using a non-transitory computer-readable medium comprising:
a first code component to provide a plurality of pins routed together on a net, wherein each pin has an current value;
a second code component to calculate a current requirement for each track segment of the net, wherein the net has three of more tracks coupled at a node;
a third code component to determine a track width for each track segment using a current density function; and
a fourth code component to perform an automated routing of a first track segment of the net, wherein the automatically routed first track segment has a track width as previously determined using the current density function, and wherein the second code component calculating a current requirement for each track segment of the net comprises:
a fifth code component to find a pin of the net with the largest current value and set as a main driver pin;
a sixth code component to set the largest current value as a current requirement for a second track segment connected to the main driver pin, wherein the second track segment is connected to third and fourth track segments at one point; and
a seventh code component to set a current requirement for a third track segment as a sum of the largest current value and a current requirement for the fourth track segment.

18. The system of claim 17 wherein the fourth component to perform an automated routing of a first track segment of the net comprises:
an eighth code component to provide pins of the net;
a ninth code component to form a grid based on positions of the pins;
a tenth code component to find a first route path to connect the pins using the grid; and a eighth code component to route around an obstacle in the first route path using an unobstructed path, wherein the unobstructed path is not on the grid.

* * * * *